(12) United States Patent
Wilhelm et al.

(10) Patent No.: US 7,993,758 B2
(45) Date of Patent: *Aug. 9, 2011

(54) SLIDE BEARING COMPOSITE MATERIAL

(75) Inventors: Maik Wilhelm, Ober-Olm (DE); Uwe Lehmann, Alzey (DE); Gerd Andler, Bad Schwalbach (DE); Philippe Damour, Frankfurt am Main (DE); Neil Graham, Wiesbaden (DE)

(73) Assignee: Federal-Mogul Wiesbaden GmbH & Co. KG, Wiesbaden (DE)

( * ) Notice: Subject to any disclaimer, the term of this patent is extended or adjusted under 35 U.S.C. 154(b) by 448 days.

This patent is subject to a terminal disclaimer.

(21) Appl. No.: 11/914,356

(22) PCT Filed: May 13, 2006

(86) PCT No.: PCT/EP2006/004517
§ 371 (c)(1),
(2), (4) Date: Jun. 11, 2008

(87) PCT Pub. No.: WO2006/120024
PCT Pub. Date: Nov. 16, 2006

(65) Prior Publication Data
US 2009/0081471 A1    Mar. 26, 2009

(30) Foreign Application Priority Data

May 13, 2005   (DE) .................. 10 2005 023 309

(51) Int. Cl.
*B32B 15/04* (2006.01)
*B32B 15/08* (2006.01)
*B32B 15/20* (2006.01)
*F16C 33/00* (2006.01)

(52) U.S. Cl. ........ 428/626; 428/457; 428/644; 428/674; 384/42

(58) Field of Classification Search .................. 428/457, 428/626, 624, 643, 644, 645, 646, 647, 648, 428/673, 674, 675, 676, 680, 650, 652, 473.5, 428/474.4
See application file for complete search history.

(56) References Cited

U.S. PATENT DOCUMENTS

| | | | |
|---|---|---|---|
| 1,658,186 | A | 2/1928 | Corson |
| 2,137,282 | A | 11/1938 | Hensel et al. |
| 2,185,958 | A | 1/1940 | Strang et al. |
| 2,241,815 | A | 5/1941 | Hensel et al. |
| 669,334 | A | 4/1952 | Ireland et al. |
| 5,209,578 | A | 5/1993 | Eastham et al. |
| 5,482,782 | A | 1/1996 | Tanaka et al. |
| 6,273,972 | B1 | 8/2001 | Andler |
| 6,475,635 | B1 | 11/2002 | Sakai et al. |
| 2001/0016267 | A1 | 8/2001 | Huhn et al. |
| 2003/0059137 | A1 | 3/2003 | Kawagoe et al. |
| 2003/0099853 | A1 | 5/2003 | Takayama et al. |
| 2003/0209103 | A1 | 11/2003 | Takayama et al. |
| 2009/0081471 | A1* | 3/2009 | Wilhelm et al. ............. 428/457 |
| 2009/0263053 | A1* | 10/2009 | Andler ........................ 384/42 |
| 2010/0068557 | A1* | 3/2010 | Andler ........................ 428/677 |

FOREIGN PATENT DOCUMENTS

| | | |
|---|---|---|
| AT | 389 356 B | 4/2008 |
| DE | 592708 | 2/1934 |
| DE | 1191114 | 4/1965 |
| DE | 15 58 474 A1 | 3/1970 |
| DE | 28 53 774 | 7/1980 |
| DE | 36 42 825 C1 | 1/1988 |
| DE | 4103117 C2 | 8/1991 |
| DE | 43 28 920 A1 | 4/1994 |
| DE | 43 28 921 A1 | 4/1994 |
| DE | 44 15 629 C1 | 8/1995 |
| DE | 19514836 C2 | 10/1996 |
| DE | 195 25 330 A1 | 1/1997 |
| DE | 195 25 330 A2 | 1/1997 |
| GB | 2384007 | 7/2003 |

* cited by examiner

*Primary Examiner* — Michael Lavilla
(74) *Attorney, Agent, or Firm* — Robert L. Stearns; Dickinson Wright, PLLC

(57) ABSTRACT

The invention relates to a slide bearing composite material which comprises a support layer from a copper alloy and a bearing coating applied to said support layer. The copper alloy may comprise 0.5 to 5% by weight of nickel, 0.2 to 2.5% by weight of silicon, ≦0.1% by weight of lead. The bearing coating can be a galvanic layer, a sputter layer or a plastic layer. The invention also relates to methods of producing such a composite material.

32 Claims, No Drawings

SLIDE BEARING COMPOSITE MATERIAL

RELATED APPLICATIONS

This application is related to other applications filed on the same date herewith under Ser. No. 11/914,350 (based on PCT/EP/2006/004505), Ser. No. 11/914,352 (based on PCT/EP/2006/004517), and Ser. No. 11/914,360 based on PCT/EP/2006/004507).

BACKGROUND OF THE INVENTION

1. Technical Field

The invention relates to a plain bearing composite material. The invention further relates to a use thereof and production methods therefor.

2. Related Art

Known from DE 44 15 629 C1 is the use of a copper-nickel-silicon alloy for producing wear-resistant objects with emergency running properties such as, for example, cast pistons for pressure casting machines. The alloy described in DE 44 15 629 C1 consists of 1-4% nickel, 0.1-1.5% silicon and with the remainder being copper, and is used as a solid material.

U.S. Pat. No. 2,137,282 describes an alloy comprising 0.1-30% nickel, 0.05-3% silicon and the remainder copper. Following appropriate heat treatment, this alloy is distinguished by high hardnesses and good electrical conductivities.

U.S. Pat. No. 1,658,186 describes a copper-nickel-silicon alloy, where silicides acting as hard particles are discussed in detail. Various heat treatment methods are also specified for adjusting the hardness.

Another copper-nickel-silicon alloy is found in U.S. Pat. No. 2,241,815 where the nickel fraction is 0.5-5% and the silicon fraction is 0.1-2%.

U.S. Pat. No. 2,185,958 describes alloys comprising 1% nickel, 3.5% silicon and the remainder copper, as well as 1.5% silicon and 1% nickel and the remainder copper.

DE 36 42 825 C1 discloses a plain bearing material comprising 4 to 10% nickel, 1-2% aluminium, 1-3% tin and the remainder copper as well as the usual impurities, which should have a high strength and long lifetime. Solid material bushings are produced from this plain bearing material.

GB 2384007 describes a plain bearing composite material with a steel back on which a sintered layer of a copper alloy is applied, having a maximum hardness of 130 HV. The copper alloy comprises 1-11 wt. % tin, up to 0.2 wt. % phosphorus, maximum 10 wt. % nickel or silver, maximum 25 wt. % lead and bismuth.

Plain bearing shells usually have a steel back on which a bearing material and a lining are applied. The steel back exhibits the required stiffness and strength to guarantee a press fit in the bearing housing. A disadvantage, however, is that the damping properties of bearing shells and bearing bushes constructed from such a composite material are not adequate for many applications. In particular, in cases of narrow bearing shells in combination with insufficiently stiff shafts, undesirable edge carriers and increased wear of the bearing metal frequently occurs. The reason for this is the unfavourable ratio of modulus of elasticity and strength of the steel composition material which renders difficult or prevents elastic adaptation of the bearing in cases of critical loading.

SUMMARY OF THE INVENTION

It is therefore the object of the invention to provide a plain bearing composite material without steel backs. It is also an object to provide a use and production methods.

DETAILED DESCRIPTION

It has surprisingly been found that a steel back can be dispensed with for ensuring a press fit if a copper alloy with nickel-silicon fractions in the claimed ranges is used.

The advantages of these alloys consist in that they can be adjusted over a wide range with regard to their structure and therefore their mechanical properties. It is therefore possible to adjust the strength and the mechanical properties so that the copper alloy takes over the function of the steel back, which can thus be omitted. At the same time, these copper alloys possess excellent damping properties in addition to the required strength.

The manufacture of the plain bearing element from such a plain bearing composite material is simplified and is therefore more cost-effective as a result of dispensing with the steel back.

The favourable ratio of modulus of elasticity and adjustable strength in these alloys has proved to be particularly advantageous for the use as plain bearings for highly loaded motors.

A further advantage is that the coefficients of thermal expansion of the copper alloys are of the order of magnitude of the coefficients of thermal expansion for aluminium so that plain bearing shells made of the composite material according to the invention can preferably be used in aluminium housings. At high temperatures, a good press fit is therefore achieved as before.

The strength of the copper alloy is preferably adjusted by a thermo-mechanical treatment, in particular by rolling and annealing.

The method of producing strip material for the plain bearing composite material according to the invention comprises the following process steps:

Producing strip material from a copper-nickel-silicon alloy with subsequent thermo-mechanical treatment comprising the following steps:

a first annealing of the strip material at temperatures higher than 500° C. for at least 3 hours, at least one first rolling of the strip material, wherein a degree of deformation of at least 20% is implemented, at least one second annealing at temperatures higher than 500° C. and at least one second rolling of the strip material, where a degree of deformation greater than 30% is implemented.

The second annealing is preferably carried out continuously in a strip annealing plant with a strip feed rate of at least 3 m/min, in particular 3-5 m/min at temperatures >500° C.

The strength of the strip material is adjusted by means of the second rolling step, where tensile strength values of 550 to 750 MPa are preferably achieved.

The structure after the thermo-mechanical treatment is distinguished by a linear matrix structure, where fine, uniformly distributed intermetallic NiSi-based precipitations are present within this line structure.

Said tensile strength values are significantly higher than those of the steel of the steel composite material which would be plastically deformed under lower loading, which leads to an increased play of the plain bearing made of the composite bearing material and to a loss of damping properties. The advantage of the copper alloys according to the invention is that the yield point can be increased to such an extent that under high loading of the bearing, the elastic properties can be retained.

The thickness of the initial strip material and the final thickness of the strip material are usually predefined. In order to be able to achieve different strength values, the first rolling is therefore preferably carried out with such degrees of deformation that the desired strength values are established during the second rolling. This means that for example, in order to achieve high strength values only a small reduction in thickness is carried out during the first rolling whereas for low strength values, high degrees of deformation are achieved during the first rolling.

Sheet bars are separated from the strip material to produce plain bearing elements following coil slitting and the sheet bars are deformed by known deforming steps to form plain bearing elements. The final process is preferably the machining of the linings and the application of the lining, also referred to as sliding layer.

The lining is applied by means of electroplating, PVD processes, in particular sputtering or other processes specified in the claims, optionally after applying an intermediate layer. Optionally, a lead-in layer is also applied to the lining.

The tribological properties of the composite material are adjusted by the lining.

In the copper-nickel-silicon alloy, the nickel fraction is 0.5-5 wt. %, preferably 1.0 to 3.0 wt. %, in particular 1.5 to 2.2 wt. % and the silicon fraction is 0.2-2.5 wt. %, preferably 0.4 to 1.2 wt. % or 0.5 to 1.5 wt. %.

The copper-nickel-silicon alloy can contain 0.05-2.0 wt. % manganese, preferably 0.15-1.5 wt. %.

It has been shown that if the weight ratio of nickel to silicon is between 2.5 and 5 (nickel silicon=2.5 to 5), the tribological properties can be improved, in particular corrosion of the bearing material can be reduced significantly. With these weight ratios the nickel-silicon compounds responsible for the good tribological properties are favoured and formed in sufficient measure.

The copper alloys can contain further micro-alloying elements. The backing layer, referred to hereafter as supporting layer preferably contains 0.05-0.4 wt. %, preferably 0.075 to 0.25 wt. % of at least one micro-alloying element. Possible micro-alloying elements are, for example, chromium, titanium, zirconium, zinc and magnesium, individually or in combination.

It is furthermore advantageous if the lining consists of an electroplated layer. Electroplated layers are multifunctional materials which are characterised, inter alia, by good embedding properties for foreign particles, by lead-in properties or matching to sliding partners, as corrosion protection and by good emergency running properties in cases of oil deficiency. In particular, when using low-viscosity oils, electroplated layers are advantageous because mixed friction states in which said properties have an effect can occur more frequently in this case.

The electroplated layer preferably consists of lead-tin-copper, tin-copper, bismuth-copper alloy or of pure bismuth. in the lead-tin-copper alloys the fraction of tin is preferably 4-20 wt. % and the fraction of copper is 1-10 wt. %. In the bismuth-copper alloys the preferred fractions of copper are 1-20 wt. %. The lining can be applied by means of a thermal coating method. Possible thermal coating methods are plasma spraying, high-speed flame spraying and cold gas spraying.

A further preferred method is the PVD method and in this case in particular, sputtering. Sputtered layers preferably consist of aluminium-tin alloys, aluminium-tin-copper alloys, aluminium-tin-nickel-manganese alloys, aluminium-tin-silicon alloys or aluminium-tin-silicon-copper alloys.

In these alloys, the tin fraction is preferably 8-40 wt. %, the copper fraction 0.5-4.0 wt. %, the silicon fraction 0.02-5.0 wt. %, the nickel fraction 0.02-2.0 wt. % and the manganese fraction 0.02-2.5 wt. %.

According to a further embodiment, the lining can consist of a plastic layer. Plastic layers are preferably applied by means of a varnishing or printing process such as, for example, screen or pad printing, by dipping or spraying.

The surface to be coated must be suitably prepared for this purpose by degreasing, chemical or physical activation and/or mechanical roughening, for example, by sand blasting or grinding.

The matrix of the plastic layers preferably consists of high-temperature-resistant resins such as PA1. In addition, additives such as $MoS_2$, boron nitride, PTFE or graphite can be embedded in the matrix. The fractions of additives can preferably lie between 5 and 50 vol. % individually or in combination.

In order to improve the binding, preferably at least one intermediate layer is arranged between the supporting layer and the lining. This intermediate layer can also be an electroplated layer even if the lining is applied by means of a sputtering process.

The electro-plated intermediate layer can preferably contain nickel or silver or consist of these elements. It is also possible to apply two intermediate layers of nickel and tin-nickel.

Instead of electro-plated intermediate layers, sputtered intermediate layers can also be provided. In this case, nickel alloy layers, for example, comprising NiCu30, pure nickel layers, nickel-chromium layers preferably containing 15-25% chromium, zinc layers, zinc alloy layers, chromium and copper layers, nickel-chromium alloy layers, nickel-copper alloy layers, copper alloy layers or chromium-nickel alloy layers are preferred.

The thickness of the supporting layer is preferably 1.2-4 mm, preferably 1.3-3.5 mm, in particular 1.4-3.0 mm.

The preferred thickness of the intermediate layer is 1-12 µm, preferably 0.5-7.0 µm, in particular 1.0-4.0 µm and the thickness of the lining is 4-30 µm, preferably 8-20 µm, in particular 10-16 µm.

The thickness of the lead-in layer is 0.2-12 µm, preferably 0.2 to 6 µm, in particular 0.2 to 3 µm.

Preferred uses of plain bearing composite materials are those for plain bearing shells.

Exemplary copper alloys are:

TABLE 1

| | (values in wt. %) | | | | |
|---|---|---|---|---|---|
| Example | 1 | 2 | 3 | 4 | 5 |
| Ni | 1.9 | 1.5 | 0.8 | 3.8 | 2.8 |
| Si | 0.6 | 0.5 | 0.25 | 1.2 | 0.8 |
| Mn | 0.15 | 0.05 | 0.05 | 0.1 | 0.05 |
| Pb | <0.1 | <0.1 | <0.1 | <0.1 | <0.1 |
| Cr | | 0.15 | | | 0.15 |
| Ti | | | | 0.15 | |
| Zr | | | 0.2 | | 0.15 |
| Cu | Remainder | Remainder | Remainder | Remainder | Remainder |

An exemplary process provides the following process steps:
 continuous casting of a copper alloy, in particular double continuous casting, having a width of 300 mm and a thickness of 10 mm to produce strip material
 bilateral milling and subsequent winding of the strip material.

This is followed by a first annealing step in a bell-type furnace at 650° C. over 4 hours. A first rolling is then carried out comprising three rolling steps. In all three rolling steps, a deformation of 31% is performed, whereby the thickness is reduced to 5.5 mm in the first rolling step, to 3.8 mm in the second rolling step, and to 2.6 mm in the third rolling step.

The strip is then annealed in a strip annealing plant at 650° C. with a feed rate of 4 m/min. This is followed by a second rolling comprising a rolling step with a degree of deformation of 40%, where the thickness is reduced to 1.56 mm. This is followed by coil slitting with dimensions of 95 mm wide× 1.56 mm thick.

Examples of electro-plated linings are given in Table 2.

TABLE 2

(values in wt. %)

| Example | 1 | 2 | 3 | 4 | 5 |
|---|---|---|---|---|---|
| Lead | 88 | 78 | | | |
| Tin | 10 | 14 | 94 | | |
| Bismuth | | | | 100 | 95 |
| Copper | 2 | 8 | 6 | | 5 |

A preferred electro-plated lining comprises a tin matrix in which tin-copper particles are embedded comprising 39-55 wt. % copper and the remainder tin. The particle diameter is preferably 0.5 μm to 3 μm. This electro-plated layer is preferably applied to two intermediate layers where the first intermediate layer preferably consists of Ni and the second intermediate layer located thereabove consists of nickel and tin. The Ni fraction of the second intermediate layer is 30-40 wt. % Ni. The first intermediate layer has a thickness of 1 to 4 μm and the second intermediate layer has a thickness of 2 to 7 μm.

Examples of sputtered layers are given in Table 3

TABLE 3

(values in wt. %)

| Example | 1 | 2 | 3 | 4 | 5 |
|---|---|---|---|---|---|
| Al | Remainder | Remainder | Remainder | Remainder | Remainder |
| Sn | 22 | 35 | 25 | 10 | 20 |
| Cu | 0.7 | 1.2 | 0.7 | 0.5 | 0.5 |
| Si | | | 2.5 | | 1.5 |
| Mn | | | | 1.5 | |
| Ni | | | | 0.7 | 0.7 |

Examples of plastic linings are given in Table 4.

TABLE 4

(values in vol. %)

| Example | 1 | 2 | 3 | 4 | 5 |
|---|---|---|---|---|---|
| PAI | 70 | 80 | 70 | 75 | 65 |
| MoS2 | 30 | | | | 20 |
| BN | | 20 | | | |
| Graphite | | | 30 | | |
| PTFE | | | | 25 | 15 |

All these linings can be combined with supporting layers of the copper alloys.

Lead-in layers on these layer combinations can be pure tin or indium layers as well as all said electro-plated and plastic layers, where the lead-in layer is preferably to be selected so that it is softer than the lining used.

The invention claimed is:

1. A plain bearing composite material with a supporting layer free of a further metal backing, said supporting layer made of a copper alloy containing 0.5-5 wt. % nickel, 0.2-2.5 wt. % silicon, ≦0.1 wt. % lead and the remainder copper and with a sliding layer applied to the supporting layer.

2. The plain bearing composite material according to claim 1, wherein the copper alloy contains 0.05-2 wt. % manganese.

3. The plain bearing composite material according to claim 1, wherein the weight ratio of nickel to silicon lies between 2.5 and 5.

4. The plain bearing composite material according to claim 1, wherein the supporting layer contains at least one micro-alloying element.

5. The plain bearing composite material according to claim 4 wherein said at least one micro-alloying element totals 0.05-0.4 wt. % of said supporting layer.

6. The plain bearing composite material according to claim 4, wherein the micro-alloying elements are selected from the group consisting of:
chromium, titanium, zirconium, zinc or magnesium.

7. The plain bearing composite material according to claim 1, wherein the sliding layer consists of an electro-plated layer.

8. The plain bearing composite material according to claim 1, wherein the sliding layer consists of a layer applied by means of a thermal coating method.

9. The plain bearing composite material according to claim 1, wherein at least one intermediate layer is arranged between the supporting layer and the sliding layer.

10. The plain bearing composite material according to claim 9, wherein the intermediate layer is an electro-plated layer.

11. The plain bearing composite material according to claim 10, wherein the intermediate layer consists of nickel or silver.

12. The plain bearing composite material according to claim 10, wherein two intermediate layers of nickel and tin-nickel are provided.

13. The plain bearing composite material according to claim 9, wherein the intermediate layer is a sputtered layer.

14. The plain bearing composite material according to claim 9, wherein said at least one intermediate layer is formed from the group consisting of: a nickel alloy, a nickel-chromium alloy, nickel-copper alloy, zinc alloy, zinc, chromium, copper, copper-alloy, nickel, chromium-nickel alloy or nickel-chromium.

15. The plain bearing composite material according to claim 9, wherein said at least one intermediate layer consists of an electroplated layer and the sliding layer consists of a sputtered layer.

16. The plain bearing composite material according to claim 1, wherein the sliding layer comprises a layer applied by means of a PVD process.

17. The plain bearing composite material according to claim 16, wherein the sliding layer consists of a sputtered layer.

18. The plain bearing composite material according to claim 17, wherein the sputtered layer consists of either an aluminium-tin alloy, aluminium-tin-silicon alloy, aluminium-tin-copper alloy, an aluminium-tin-silicon-copper alloy or an aluminium-tin-nickel-manganese alloy.

19. The plain bearing composite material according to claim 18, wherein in the alloys of said sputtered layer the tin fraction is 8-40 wt. %, in the alloys of said sputtered layer containing copper the copper fraction is 0.5-4.0 wt. %, in the alloys of said sputtered layer containing silicon the silicon fraction is 0.02-5.0 wt. %, in the alloy of said sputtered layer containing nickel the nickel fraction is 0.02-2.0 wt. % and in the alloy of said sputtered layer containing manganese the manganese fraction is 0.02-2.5 wt. %.

20. The plain bearing composite material according to claim 1, wherein a lead-in layer is provided on the sliding layer.

21. The plain bearing composite material according to claim 20, wherein the lead-in layer consists of either tin, lead, copper or indium or as a plastic layer.

22. The plain bearing composite material according to claim 1, wherein the thickness of the supporting layer is 1.2-4 mm.

23. A plain bearing composite material with a supporting layer made of a copper alloy containing 0.5-5 wt. % nickel, 0.2-2.5 wt. % silicon, ≦0.1 wt. % lead and the remainder copper and with a sliding layer applied to the supporting layer, wherein the sliding layer consists of an electro-plated layer and wherein the electroplated layer consists of either lead-tin-copper alloy, tin-copper alloy, bismuth-copper alloy or of bismuth.

24. The plain bearing composite material according to claim 23, wherein in the lead-tin-copper alloys the fraction of tin is 4-20 wt. % and the fraction of copper is 1-10 wt. %.

25. The plain bearing composite material according to claim 24, wherein in the bismuth-copper alloys the copper fraction is 1-20 wt. % and in the tin-copper alloys the copper fraction is 2-20 wt. %.

26. A plain bearing composite material with a supporting layer made of a copper alloy containing 0.5-5 wt. % nickel, 0.2-2.5 wt. % silicon, ≦0.1 wt. % lead and the remainder copper and with a sliding layer applied to the supporting layer, wherein the sliding layer consists of a plastic layer.

27. The plain bearing composite material according to claim 26, wherein the sliding layer has a matrix consisting of high-temperature-resistant resin.

28. The plain bearing composite material according to claim 26, wherein the plastic sliding layer includes at least one filler selected from the group consisting of $MoS_2$, boron nitride, PTFE or graphite.

29. The plain bearing composite material according to claim 28, wherein the fractions of the fillers are present totaling 5-50 vol. %.

30. A plain bearing composite material with a supporting layer made of a copper alloy containing 0.5-5 wt.% nickel, 0.2-2.5 wt. % silicon, ≦0.1 wt. % lead and the remainder copper and with a sliding layer applied to the supporting layer, wherein at least one intermediate layer is arranged between the supporting layer and the sliding layer, wherein the thickness of said at least one intermediate layer is 1-12 μm.

31. A plain bearing composite material with a supporting layer made of a copper alloy containing 0.5-5 wt. % nickel, 0.2-2.5 wt. % silicon, ≦0.1 wt. % lead and the remainder copper and with a sliding layer applied to the supporting layer, wherein the thickness of the sliding layer is 4-30 μm.

32. A plain bearing composite material with a supporting layer made of a copper alloy containing 0.5-5 wt. % nickel, 0.2-2.5 wt. % silicon, ≦0.1 wt. % lead and the remainder copper and with a sliding layer applied to the supporting layer and a lead-in layer is provided on the sliding layer, wherein the thickness of the lead-in layer is 0.2 to 12 μm.

* * * * *